(12) United States Patent
Li et al.

(10) Patent No.: US 10,446,694 B2
(45) Date of Patent: Oct. 15, 2019

(54) FIELD-EFFECT TRANSISTOR STRUCTURE HAVING TWO-DIMENSIONAL TRANSITION METAL DICHALCOGENIDE

(71) Applicant: National Applied Research Laboratories, Taipei (TW)

(72) Inventors: Kai-Shin Li, Hsinchu (TW); Bo-Wei Wu, Hsinchu (TW); Min-Cheng Chen, Hsinchu (TW); Jia-Min Shieh, Hsinchu (TW); Wen-Kuan Yeh, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 15/620,846

(22) Filed: Jun. 13, 2017

(65) Prior Publication Data

US 2018/0358474 A1 Dec. 13, 2018

(51) Int. Cl.
| | |
|---|---|
| *H01L 29/786* | (2006.01) |
| *H01L 29/08* | (2006.01) |
| *H01L 29/06* | (2006.01) |
| *H01L 29/24* | (2006.01) |
| *H01L 29/78* | (2006.01) |
| *H01L 29/66* | (2006.01) |
| *H01L 21/02* | (2006.01) |

(Continued)

(52) U.S. Cl.
CPC .. *H01L 29/78696* (2013.01); *H01L 21/02697* (2013.01); *H01L 29/0657* (2013.01); *H01L 29/0688* (2013.01); *H01L 29/0847* (2013.01); *H01L 29/1037* (2013.01); *H01L 29/24* (2013.01); *H01L 29/42356* (2013.01); *H01L 29/66969* (2013.01); *H01L 29/778* (2013.01); *H01L 29/785* (2013.01); *H01L 29/78603* (2013.01); *H01L 29/78618* (2013.01)

(58) Field of Classification Search
None
See application file for complete search history.

(56) References Cited

U.S. PATENT DOCUMENTS

2014/0183453 A1 7/2014 Kim et al.
2015/0364592 A1* 12/2015 van Dal ............... H01L 29/785
257/29

(Continued)

FOREIGN PATENT DOCUMENTS

CN 105322018 2/2016

OTHER PUBLICATIONS

2016 IEEE Symposium on VLSI Technology, Honolulu, HI, USA; Jun. 14, 2016: "MoS2 U-shape MOSFET with 10 nm channel length and poly-Si source/drain serving as seed for full wafer CVD MoS2 availability".

*Primary Examiner* — Whitney Moore

(57) ABSTRACT

A field-effect transistor structure having two-dimensional transition metal dichalcogenides includes a substrate, a source/drain structure, a two-dimensional (2D) channel layer, and a gate layer. The source/drain structure is disposed on the substrate and has a surface higher than a surface of the substrate. The 2D channel layer is disposed on the source and the drain and covers the space between the source and the drain. The gate layer is disposed between the source and the drain and covers the 2D channel layer. The field-effect transistor having two-dimensional transition metal dichalcogenides is a planar field-effect transistor or a fin field-effect transistor.

11 Claims, 11 Drawing Sheets

(51) Int. Cl.
*H01L 29/423* (2006.01)
*H01L 29/778* (2006.01)
*H01L 29/10* (2006.01)

(56) References Cited

U.S. PATENT DOCUMENTS

2016/0372553 A1* 12/2016 Xiao .................. H01L 29/1054
2017/0012117 A1* 1/2017 Radosavljevic .... H01L 29/7782

* cited by examiner

FIELD-EFFECT TRANSISTOR STRUCTURE HAVING TWO-DIMENSIONAL TRANSITION METAL DICHALCOGENIDE

FIELD OF THE INVENTION

The present invention relates to field-effect transistor structures, and more particularly to field-effect transistor structures using two-dimensional transition metal dichalcogenides as a channel layer.

BACKGROUND OF THE INVENTION

As technology progresses, more and more electronic products have been developed. Designs of electronic products have been focusing on miniaturization in response to market demands for high performance and high convenience. Miniaturization of the electronic products are mainly achieved by using large numbers of small-scaled electronic components, such as chips, diodes, transistors or light-emitting diodes made of semiconductor materials, in the internal circuits thereof. Therefore, fin field-effect transistors (FinFETs) have been developed for for improving performance of electronic components. As compared with conventional planar field-effect transistors (planar FETs), FinFETs include multiple control gates, so that components with greater performance and low power consumption can be designed. In conventional planar FETs and FinFETs, however, silicon substrate is used in conventional manufacturing methods and structures as a current channel; therefore, a bottleneck exists in simultaneously maintaining performances and reducing the size of semiconductor devices.

Since two-dimensional materials have layered structures, two-dimensional materials, especially the most well-known material "graphene", show high electron mobility and low resistivity, and have resistance lower than copper or silver. Therefore, two-dimensional materials are considered as materials having the smallest resistance in the world, and are suitable for developing thinner and more conductive sub-10 nm electronic components or metal wires. Although graphene has many good physical properties, energy band of graphene has no energy gap, hindering its use as channel layers in semiconductor devices. The idea of using novel two-dimensional materials (e.g. transition metal dichalcogenides) other than graphene to form channel layers has been proposed, aiming to utilize the weak van der Waals bonding between layers of the two-dimensional materials to increase the possibilities of two-dimensionalization of channels for further industrial applications. As good semiconductor characteristics are required, candidates of the two-dimensional materials are very limited and fabrication using the two-dimensional materials also encounters difficulties. Although the academia and industry have been focusing on research and development of the materials, film growth characteristics of the two-dimensional materials affect the formation of a complete or large two-dimensional film layer and application thereof to an entire wafer surface during fabrication; therefore, the materials could not applied to existing fabrication processes. Although the academia have developed a lift-off process that completes the fabrication of transistors by presetting the locations and sizes of transistors so as to allow two-dimensional materials to be disposed at locations in which channels are to be formed, such approach is not only cost ineffective but also poor yielded, and most importantly, unable to be applied to production lines for mass production.

Accordingly, the application of two-dimensional materials in current technology is yet underdeveloped. Therefore, there is a need to provide manufacturing methods and structures having higher yield and applicable to existing processing fabrication technology and production lines for mass production.

SUMMARY OF THE INVENTION

The present invention provides a field-effect transistor structure having two-dimensional transition metal dichalcogenides, comprising a substrate, a source/drain structure, a two-dimensional (2D) channel layer, and a gate layer. The source/drain structure is disposed on the substrate, has a surface higher than a surface of the substrate, and includes a source and a drain. The 2D channel layer is disposed on the source and the drain and covers the space between the source and the drain. The gate layer is disposed between the source and the drain and covers the 2D channel layer.

In some embodiments of the present invention, the above field-effect transistor structure having two-dimensional transition metal dichalcogenides is a planar field-effect transistor, and the source and the drain are separated from each other by an opening.

In some embodiments of the present invention, the above 2D channel layer entirely covers an exposed portion of the substrate between the source and the drain, at least a portion of a sidewall of the drain close to the source, and at least a portion of a sidewall of the source close to the drain.

In some embodiments of the present invention, the opening has an inverted trapezoid shape with a wide top and a narrow bottom.

In some embodiments of the present invention, the above field-effect transistor structure having two-dimensional transition metal dichalcogenides further comprises an oxide layer formed on the surface of the substrate and disposed between the substrate and the 2D channel layer, and between the substrate and the source/drain structure.

In some embodiments of the present invention, a minimum distance between the source and the drain is about 2-15 nanometers In some embodiments of the present invention, the 2D channel layer has a thickness of about 0.6-5 nanometers In some embodiments of the present invention, the 2D channel layer comprises a material of one of molybdenum disulfide, tungsten diselenide, tellurium disulfide, and tellurium diselenide.

In some embodiments of the present invention, the gate layer and the 2D channel layer are entirely overlapped.

In some embodiments of the present invention, the field-effect transistor structure having two-dimensional transition metal dichalcogenides further comprises a high-k dielectric layer formed between the 2D channel layer and the gate layer.

In some embodiments of the present invention, an angle between the surface of the substrate and a source sidewall of the source close to the drain is not greater than 90°.

In addition, in some embodiments of the present invention, the above field-effect transistor structure having two-dimensional transition metal dichalcogenides is a fin field-effect transistor, and the source and drain are connected with each other by a fin structure.

In some embodiments of the present invention, the 2D channel layer conformally covers the entire fin structure between the source and the drain, and a portion of the drain close to the source and a portion of the source close to the drain.

In some embodiments of the present invention, a minimum distance between the source and the drain is about 2-15 nanometers.

In some embodiments of the present invention, the minimum distance is less than 10 nanometers.

In some embodiments of the present invention, the 2D channel layer has a thickness of about 0.6-5 nanometers.

In some embodiments of the present invention, the 2D layer comprises a material of one of molybdenum disulfide, tungsten diselenide, tellurium disulfide, and tellurium diselenide.

In some embodiments of the present invention, the gate layer and the 2D channel layer are entirely overlapped.

In some embodiments of the present invention, the above field-effect transistor structure having two-dimensional transition metal dichalcogenides further comprises a high-k dielectric layer formed between the 2D channel layer and the gate layer.

In some embodiments of the present invention, a material of the fin structure is identical to a material of the substrate.

In some embodiments of the present invention, the field-effect transistor structure having two-dimensional transition metal dichalcogenides further comprises an oxide layer formed on the surface of the substrate and disposed between the substrate and the 2D channel layer and between the substrate and the fin structure.

Accordingly, based on the structures provided by the present invention, the minimum distance between the source and the drain, i.e. channel length of the transistor, can be less than 10 nanometers (nm). There is no need to form a 2D channel layer for covering the entire wafer, and the 2D layer can be precisely and entirely formed between the source and the drain to function as a channel. A thickness of the 2D channel layer can be controlled to be less than 5 nm, and the 2D channel layer may have a minimum thickness of about 0.6 nm. Therefore, the present invention utilizes the great semiconductor properties of transition metal dichalcogenides and good structural formation characteristics thereof during deposition, to achieve good and complete coverage within 1-2 μm from the area with lower surface energy. In addition, the layer-by-layer stacking allows the thickness of the 2D channel layer to be controlled by the length of time of the fabrication, and thus reducing the channel length without affecting the performances or with improved performances.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides structures of a field-effect transistor and manufacturing methods thereof, especially structures of a field-effect transistor using two-dimensional transition metal dichalcogenides as a channel layer and manufacturing methods thereof. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
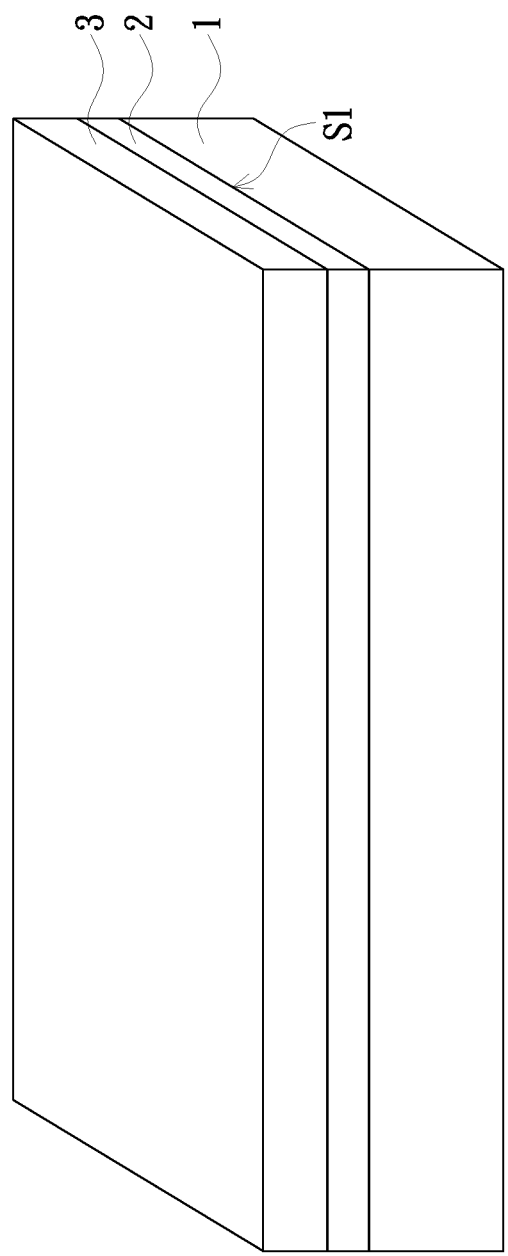
FIGS. 1A-1E are schematic structural views at different manufacturing steps of a planar field-effect transistor in accordance with an embodiment of the present invention.
Figure 1B:
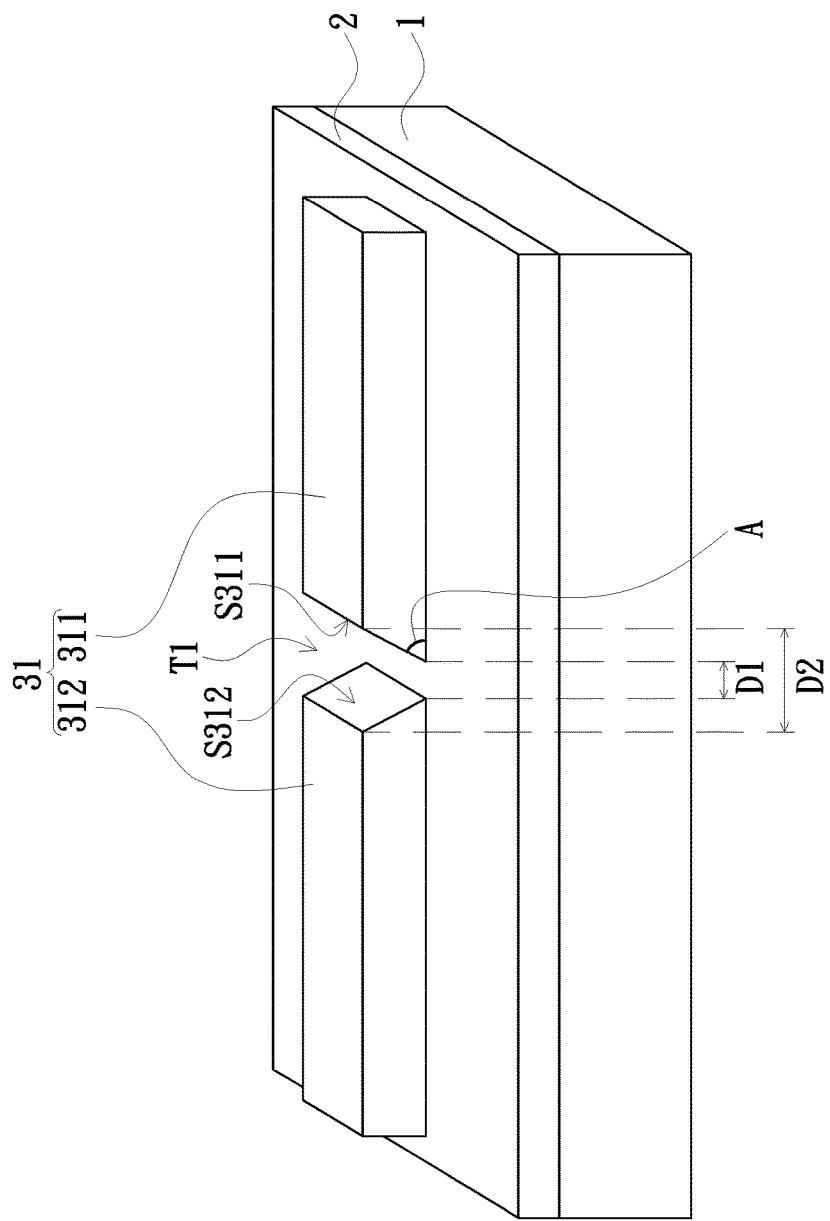
Figure 3A:
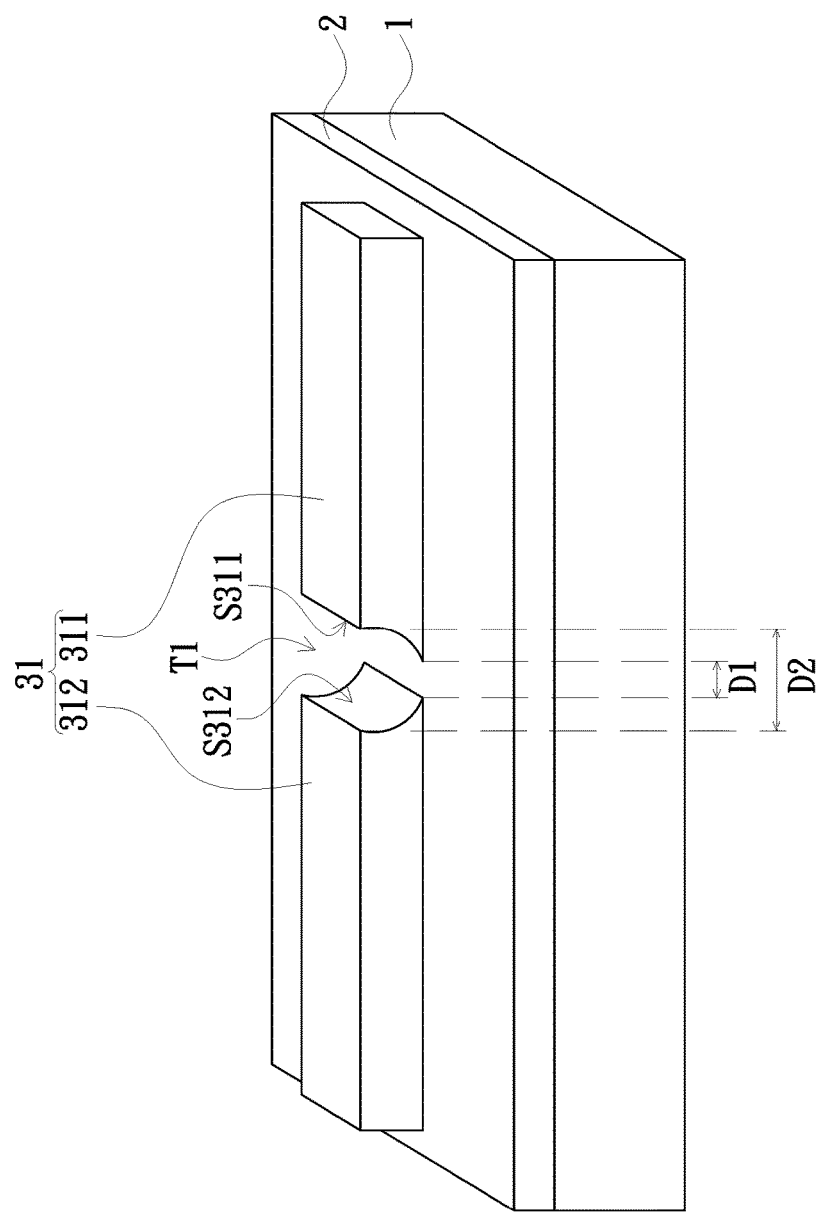
FIG. 3A is a schematic structural view of a planar field-effect transistor in accordance with an embodiment of the present invention.

Please refer to FIGS. 1A-1E, showing schematic structural views at different manufacturing steps of a planar field-effect transistor (FET) in accordance with an embodiment of the present invention. FIGS. 1A-1E illustrates a manufacturing method provided by the present invention, and it is not intended to be exhaustive or to be limited to the precise form disclosed. As shown in FIG. 1, a substrate 1 is provided. In the present embodiment, the substrate 1 is a silicon substrate, but the substrate 1 may be other substrates such as a SOI substrate, a germanium substrate, a silicon carbide (SiC) substrate, a lithium tantalite (LT, LiTaO$_3$) substrate, a lithium niobate substrate (LN, LiNbO$_3$), and etc. Next, an oxide layer 2 is optionally formed to cover a surface S1 of the substrate 1. A thickness of the oxide layer 2 is in a range of 15-30 nanometers (nm). In the present embodiment, a thermal oxidation step is performed to form the oxide layer 2 on the surface S1 of the substrate 1, and the thickness of the oxide layer 2 is 30 nanometers. In other embodiments, the oxide layer 2 can be formed by deposition or other methods. Next, a conductive material layer 3 is formed on the oxide layer 2, and a thickness of the conductive material layer 3 is in a range of 40-80 nanometers, and a material thereof can be semiconductor or metal (e.g. alloy or pure metal). In the present embodiment, a silicon-containing layer of a thickness of 50 nanometers is formed by deposition to function as the conductive material layer 3. Next, the conductive material layer 3 is patterned to remove the portion of the conductive material layer 3 to form a source/drain structure 31 shown in FIG. 1B. The source/drain structure 31 comprises a source 311 and a drain 312 being separated from each other, and the source 311 is spaced apart from the drain 312 for a minimum distance D1 of 2-15 nanometers, preferably not greater than 10 nanometers. In the present embodiment, an etching is used to remove a portion of the conductive material layer 3 so as to pattern the conductive material layer 3. By adjusting process parameters of the etching, the configuration as shown in FIG. 1B is formed. As shown in FIG. 1B, a source sidewall S311 of the source 31 close to the drain 312 and a drain sidewall S312 of the drain 32 close to the source 31 are both planar surfaces. An opening T1 having a shape of an inverted trapezoid that is wide at the top and narrow at the bottom thereof is defined by the source sidewall S311, the drain sidewall S312, a plane formed by two lower intersect lines that are the intersect line between the source sidewall S311 and a bottom surface of the source/drain structure 31 (not annotated in figure) and the intersect line between the drain sidewall S312 and the bottom surface of the source/drain structure 31 (not annotated), and a plane formed by two upper intersect lines that are the intersect line between the source sidewall S311 and an upper surface of the source/drain structure 31 (not annotated) and the intersect line between the drain sidewall S312 and the bottom surface of the source/drain structure 31 (not annotated). The opening T1 is disposed between and separate the source 311 and the drain 312. In other embodiments of the present invention, the opening T1 may have a rectangular shape (i.e. the source sidewall S311 and the drain sidewall S312 are both vertical planes) or other shapes, and is not limited to the disclosed embodiments. In addition, due to a distance between the source 311 and drain 312 is too narrow, the wide-topped opening T1 is resulted from the nature of the etching that a removal rate of portions of the conductive material layer 3 close to the substrate 1 (bottom of the conductive material layer 3) is lower than a removal rate of portions of the conductive material layer 3 away from the substrate 1 (top of the conductive material layer 3). The source sidewall S311 formed by the aforementioned etching has a concave arc shape, and the drain sidewall S312 formed by the etching also has a concave arc shape, as shown in FIG. 3A. Therefore, an angle A between the source sidewall S311 and the surface S1 of the substrate 1 is not greater than 90°. In cases where the source sidewall S311 is planar, the angle A is preferably between 30°-90°, and more preferably between 60°-89°. Similarly, the source sidewall S311 and the drain sidewall S312 may have identical or non-identical degrees of inclination/slope or curvatures.

In the present embodiment as shown in FIG. 1B, a bottom width of the opening T1 (i.e. the minimum distance D1 between the source 311 and the drain 312) is 10 nanometers, and a top width D2 of the opening T1 is 30 nanometers. A thickness of the source/drain structure 31 (i.e. a thickness of the source 311 and a thickness of the drain 312) is 50 nanometers, and the angle A is 60±2°.

Figure 1C:
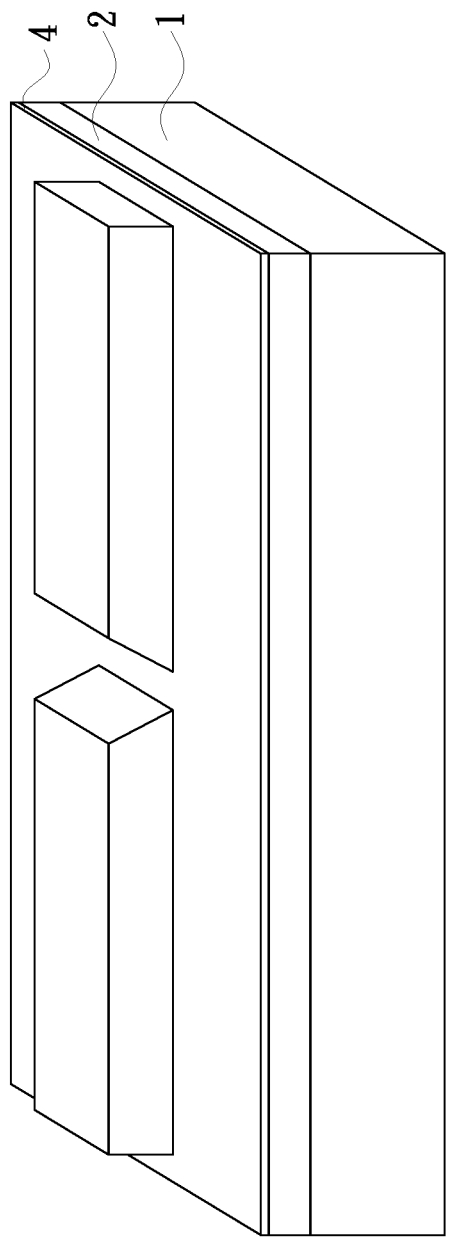

Next, as shown in FIG. 1C, a transition metal dichalcogenides compound layer 4 (hereinafter abbreviated as TMD compound layer 4) is formed on the source/drain structure 31 and between the source 311 and the drain 312. The TMD compound layer 4 may be formed by a deposition process, which includes: delivering a chalcogenide compound by a carrier gas to react with a transition metal compounds under a temperature ranging between 650-950° C. (an specific/actual reacting temperature depending on which TMD compound to be formed) to form a TMD compound (such as molybdenum disulfide, tungsten diselenide, tellurium disulfide, tellurium diselenide, etc.); and depositing the TMD compound onto the source/drain structure 31 and between the source 311 and the drain 312. In the present embodiment, argon is used as the carrier gas to deposit molybdenum disulfide, formed by reacting sulfur with molybdenum trioxide at 755±5° C., over the source/drain structure 31 and between the source 311 and the drain 312. The two-dimensional material is formed layer by layer single-atomically, and would deposit a non-planar surface from a lower surface energy spot toward the other portions of the surface. For example, lower surface energy may be found at the corner of the source/drain structure 31 close to the surface S1 of the substrate 1. In the present embodiment, the corner is the intersection of the source/drain structure 31 and the oxide layer 2, or the corner is the intersection of the source/drain structure 31 and the substrate 1 in other embodiments not having the oxide layer 2. The TMD compound may deposit along the corner and extend outward from the corner for covering the surface (i.e. depositing along and outward from bottom edges of the source/drain structure 31). According to practical experiments of the present invention and using the TMD compound of the present embodiment as an example, the inventor found that the molybdenum disulfide extends outward for about 1-2 micrometers (m) from the intersection of surfaces of different elements (that is, the bottom edges of the source/drain structure 31 in the present embodiment). Although it is impossible to form a complete layer of molybdenum disulfide covering the whole substrate 1, it is possible to form molybdenum disulfide entirely covering the opening T1 between the source 311 and drain 312, as well as portions of the source 311 and the drain 312 close to the opening T1 (including the source sidewall S311 and the drain sidewall S312 in the opening T1, or optionally further including portions of the top surface of the source 311 and the drain 312 close to the opening T1), as shown in FIG. 1C. Since only a portion of the substrate 1 is illustrated, the transition metal dichalcogenides compound layer 4 shown in FIG. 1C is illustrated as a layer that entirely covers the substrate 1; however, in actual practices, in addition to the above-described coverage, the transition metal dichalcogenides compound 4 may not be formed as an entire layer covering the entire wafer. According to the transition metal dichalcogenides compound layer 4 formed by the method provided by the present invention, thickness of the transition metal dichalcogenides compound layer 4 may be controlled as the number of atomic layers to be formed can be adjusted by controlling the rates and duration of deposition. Preferably, the transition metal dichalcogenides compound layer 4 of the embodiments of the present invention includes one to seven atomic layers for achieving better semiconductor properties. Taking the molybdenum disulfide of the present invention as an example, the thickness of the transition metal dichalcogenides compound layer 4 may be controlled to be less than 5 nanometers; and in other embodiments, and the thickness of the transition metal dichalcogenides compound layer 4 may be as thin as 0.6 nanometers (i.e. the thickness equals to that of a single atomic layer of molybdenum disulfide).

Figure 1D:
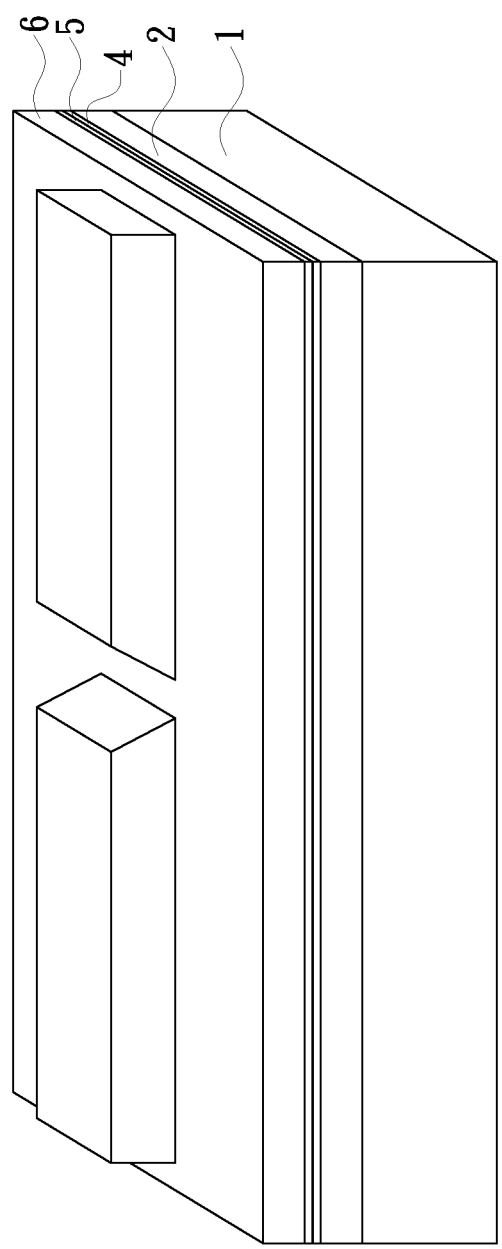

Next, as shown in FIG. 1D, a dielectric layer 5 having a thickness of 2-5 nanometers is optionally formed to conformally cover the substrate 1, the source/drain structure 31, and the transition metal dichalcogenides compound layer 4. Next, a gate material layer 6 having a thickness of 40-80 nanometers is formed to (conformally or flatly) cover the dielectric layer 5. Moreover, in some embodiments of the present invention, the gate material layer 6 conformally covers the substrate 1, the source/drain structure 31, and the transition metal dichalcogenides compound layer 4, so that the portion of the gate material layer 6 covering the opening T1 is recessed. In some embodiments of the present application, portions of the top surface of the gate material layer 6 covering the opening T1 are coplanar with the top surface of the source/drain structure 31; but the present invention is not limited thereto. An overall thickness of a stack of the transition metal dichalcogenides compound layer 4, the dielectric layer 5 and the gate material layer 6 may depend on and can be adjusted according to practical requirements. In the present embodiment, as shown in FIG. 1D, the dielectric layer 5 is 3 nanometers thick and is comprised of the high dielectric constant material $HfO_2$ (or $Al_2O_3$ or other high-k materials in other embodiments). The gate material layer 6 may have a thickness of about 50 nanometers, and comprises metal materials such as TaN/TiN, but are not limited thereto. In other embodiments, the dielectric layer 5 may comprise other suitable dielectric materials such as oxides, nitrides, oxynitrides, or other materials having high dielectric constants, for example $ZrO_2$ and $TiO_2$. The gate material layer 6 can be polysilicon or other materials such as metal or alloy.

Figure 1E:
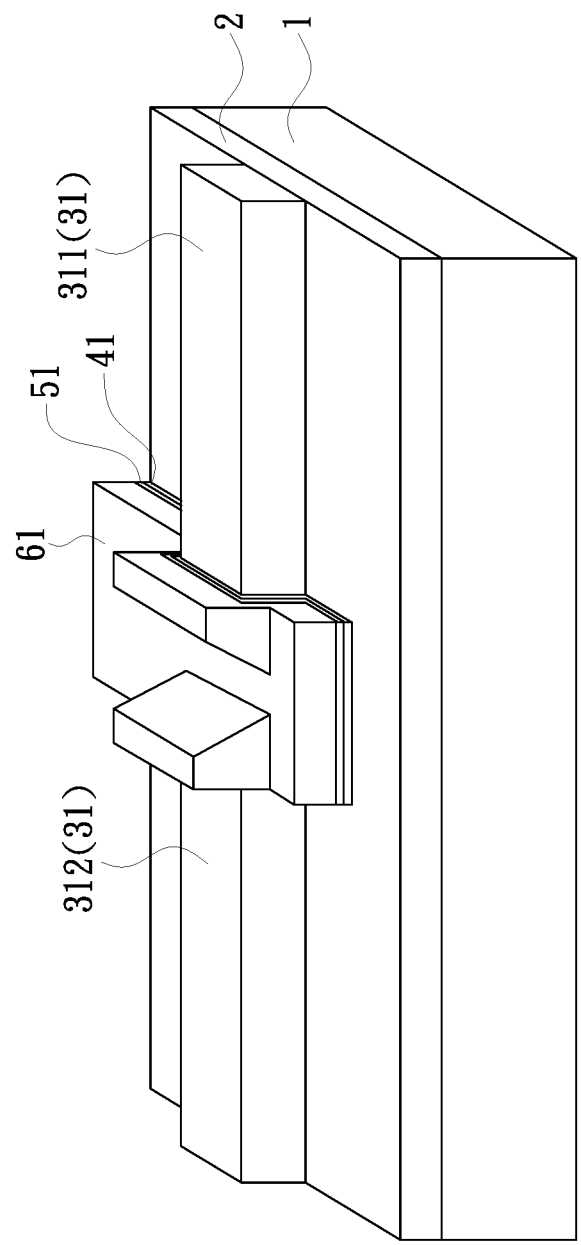
Figure 4:
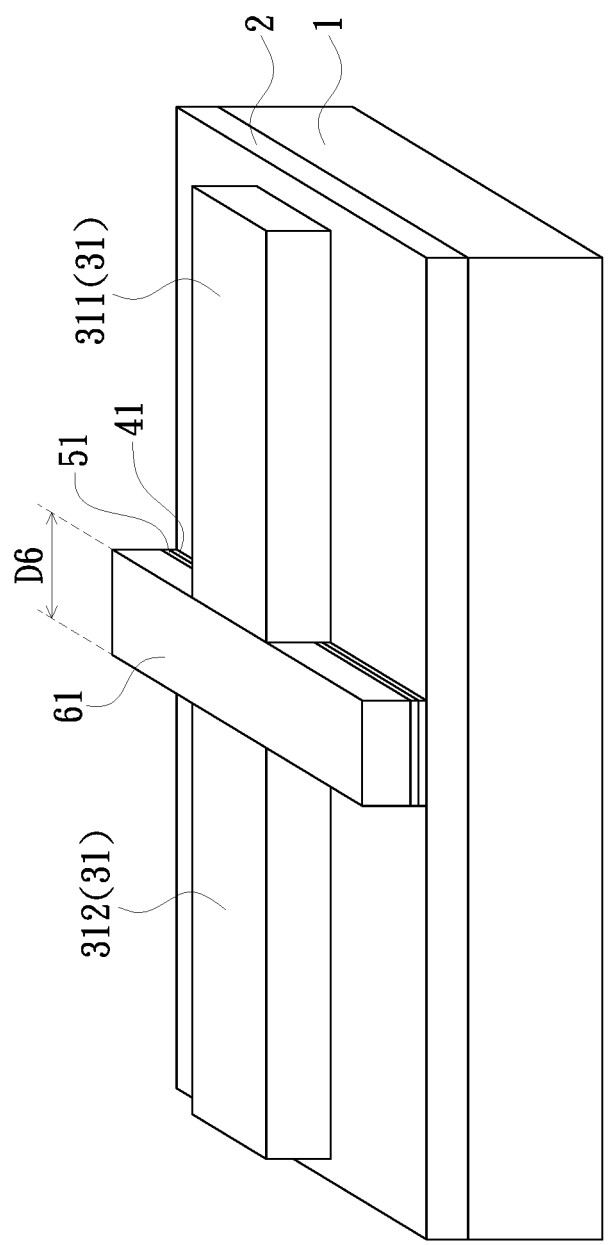
FIG. 4 is a schematic structural view of a planar field-effect transistor in accordance with a preferred embodiment of the present invention.

Next, portions of the gate material layer 6 are etched and removed to form a gate layer 61, portions of the dielectric layer 5 are etched and removed to form a dielectric layer 51, and portions of the transition metal dichalcogenides compound layer 4 are etched and removed to form a two-dimensional channel layer 41. The two-dimensional channel layer 41 entirely covers the space between the source 311 and the drain 312 (i.e. the bottom surface of the opening T1), portions of the source 311 close to the opening T1 and portions of the drain 312 close to the source 311, and optionally portions of the top surface of the source 311 close to the drain 312 and portions of the top surface of the drain 312 close to the source 311. In the present embodiment, the gate layer 61, the dielectric layer 51, and the two-dimensional channel layer 41 are entirely overlapped along the vertical direction, as shown in FIG. 1E, and a stack formed by the gate layer 61, the dielectric layer 51, and the two-dimensional channel layer entirely covers the whole opening T1 (including the space between the source 311 and the drain 312, the source sidewall S311, and the drain sidewall S312), and portions of the top surfaces of the source 311 and the drain 312 close to the opening T1. However, in consideration of possible capacitor effects that may be caused by covering the source 311 and the drain 312 with the gate layer 61, a planarization process (e.g. chemical mechanical polishing process) and/or an etching-back process is optionally performed in other embodiments of the present invention to remove portions of the gate material layer 6, portions of the dielectric layer 5, and portions of the transition metal dichalcogenides compound layer 4 outside the opening T1 to form the stack that includes the gate layer 61, the dielectric layer 51, and the two-dimensional channel layer 41 and entirely covers the space between the source 311 and the drain 312 and merely covers the portions of the source/drain structure 31 inside the opening T1 (that is, portions of or the entire source sidewall S311 and portions of or the entire drain sidewall S312), thereby forming the structure shown in FIG. 4A. Therefore, a width D6 of the gate layer 61 is greater than a bottom width D1 of the opening T1, but is not greater than the top width D2 of the opening T1. In addition, doping and activation of the source/drain structure 31 can be optionally performed before formation of the transition metal dichalcogenides compound layer 4 or after formation of the gate layer 61.

Figure 3B:
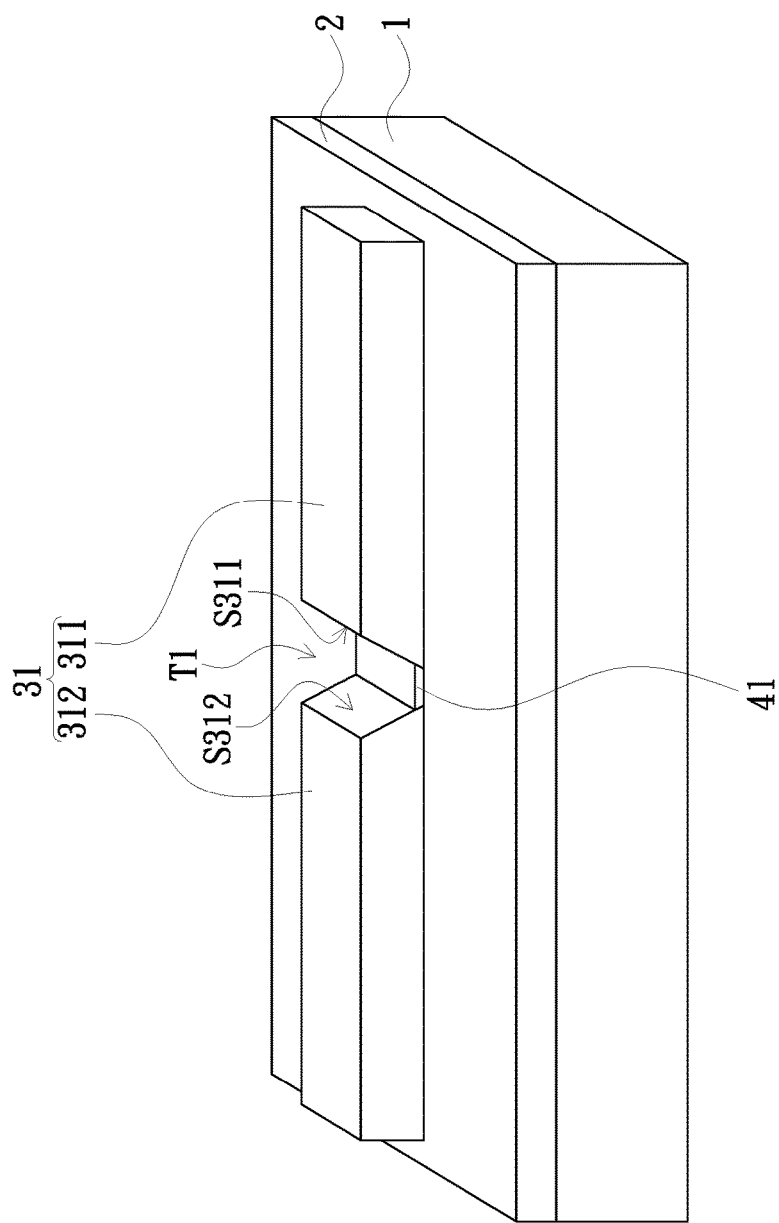
FIG. 3B is a schematic structural view of a planar field-effect transistor that applies conventional concepts to a source/drain structure in accordance with an embodiment of the present invention.

As described above, nano-scaled two-dimensional materials still possess high electron mobility and low resistivity, and are suitable for developing sub-10 nm electronic elements or transistors with thinner and faster-conductivity. Conventional planar transistor structures do not have any raised source/drain, and is manufactured by forming a blanket material layer (covering the entire substrate) and removing non-required portions of the blanket material layer. Therefore, under the concept of current manufacturing techniques, any two-dimensional material that cannot be blanketly/entirely formed on a substrate is not suitable for conventional transistor structures, and it is difficult to apply a two-dimensional material into existing manufacturing process and transistor structures. However, since the present invention has source/drain structures formed above the surface of the substrate and uses the two-dimensional transition metal chalcogenide compound with good semiconductor properties, a thin film covering a range of 1-2 micrometers outwardly from the tilted/non-planar portions of the surface is formed. As compared with the conventional processes and structures, the semiconductors provided by the present invention not only have better performances, but also meet the trend of miniaturization, being capable of forming electronic components or transistors with a channel length less than 10 nanometers. Furthermore, in transistor structures according to conventional knowledge and concepts, the gate does not particularly covers the source/drain structure. Thus, if the two-dimensional material is directly applied to conventional planar transistor structure as the channel layer, the two-dimensional material may not be able to cover, or perfectly cover, the space between the source/drain due to its formation properties. On the other hand, the two-dimensional material is merely formed between the space between the source/drain under the conventional concept; and using the source/drain structures as shown in FIGS. 1A-1E as examples, if the two-dimensional channel layer 41 is merely located at the bottom surface of the opening T1, as shown in FIG. 3B, the device performance would reduce due to the high contact resistance caused by a small contact area between the two-dimensional channel layer 41 and source 311/drain 312. The transition metal dichalcogenides compound layer has a preferable semiconductor property when its thickness is not greater than seven atomic layers; however, the thin thickness causes small contact area between the source 311/drain 312, leading to ease removal of the transition metal dichalcogenides compound layer during the subsequent ion implantation, plasma, and etching processes. Thus, during the processes of etching and removing portions of the gate material layer 6 to form the gate layer 61 of the present invention as provided above, portions of the gate layer 61 covering portions of the source 311 and portions of the drain 312 are maintained to ensure the area of coverage by the two-dimensional channel layer 41. Taking the embodiments of FIGS. 1A-1E as examples, the source sidewall S311 and the drain sidewall S312 are both inclined surfaces, such that contact surfaces between the two-dimensional channel layer 41 and the source 311/drain 312 are increased without significantly affecting the device size. In the embodiments in which the source sidewall S311 and the drain sidewall S312 are both inclined surfaces, the two-dimensional channel layer 41 may at least cover the source sidewall S311 and the drain sidewall S312, and may optionally cover the top surfaces of the source 311 and the drain 312. In the embodiments in which the source sidewall S311 and the drain sidewall S312 are both vertical surfaces, the gate layer 61 to be formed would be designed to at least partially cover portions of the top surfaces of the source 311 and the drain 312 during the process of patterning the gate material layer 6 for ensuring that the two-dimensional channel layer 41 at least covers the source sidewall S311 and the drain sidewall S312.

Therefore, according to the structures and methods provided by the present invention, the minimum distance D1 between the source 311 and the drain 312 is not greater than the width of the portion of the surface S1 of the substrate 1 exposed at the space between the source 311 and the drain 312. The distance D1 is a channel length of a subsequently formed transistor. The present invention reduces channel size of the device without affecting the performance (or with further improvement in performance) thereof by utilizing great semiconductor properties of the transition metal dichalcogenides compound; and the process provided by the present invention can be applied to mass production by effectively using the characteristics and limitations in forming the layered structure of the TMD materials. In addition, the oxide layer 2 in the above embodiment is optionally formed, and the presence of the oxide layer 2 may prevent electrons flow via the substrate 1 and allow electrons to essentially flow within the two-dimensional layer 41, thereby improving device performances. However, since the semiconductor characteristics and size of the two-dimensional channel layer 41 are both advantageous over conventional techniques, the present invention can achieve the same device performances without the presence of the oxide layer 2.

Figure 2A:
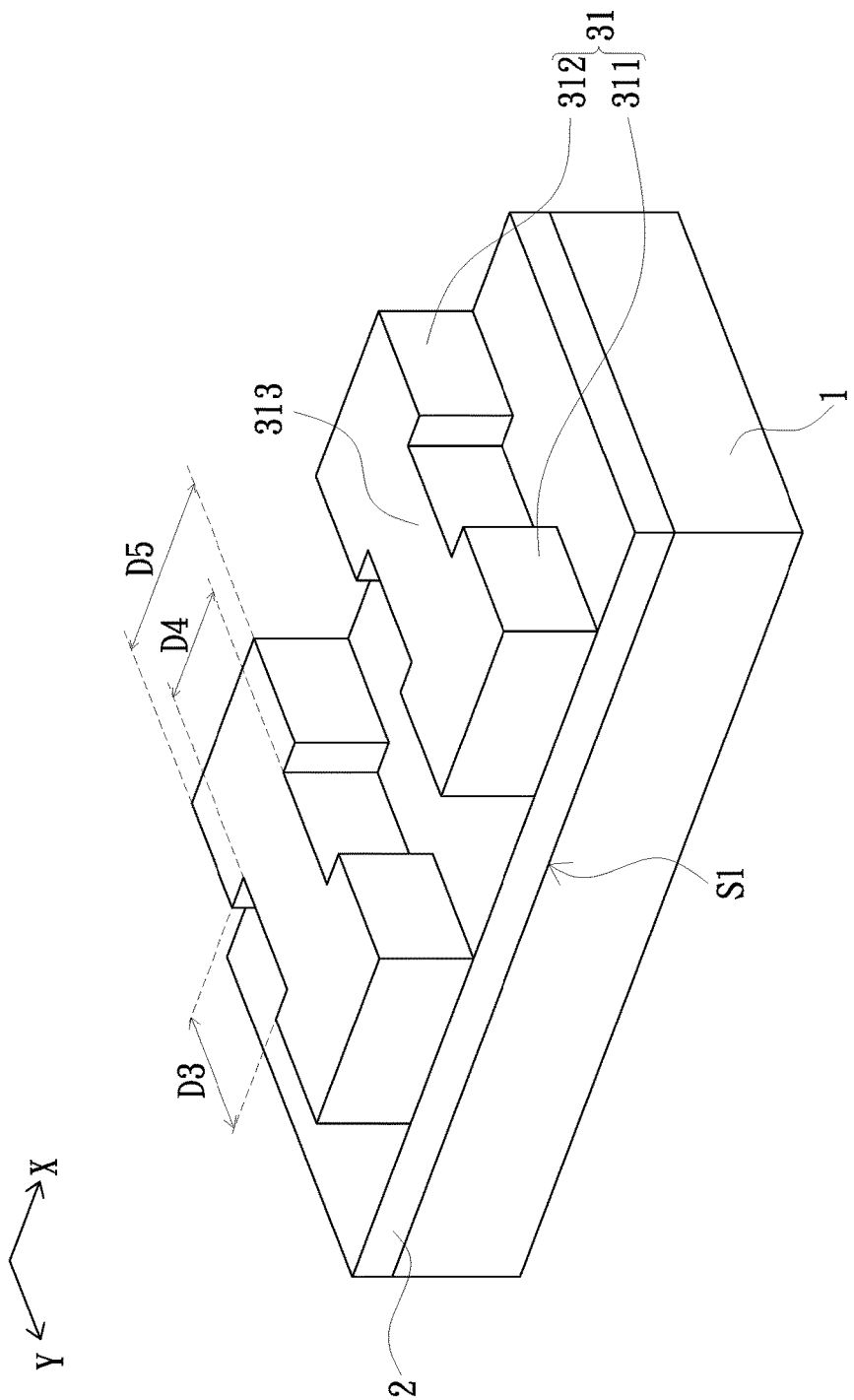
FIGS. 2A-2C are schematic structural views at different manufacturing steps of a fin field-effect transistor in accordance with an embodiment of the present invention.
Figure 2B:
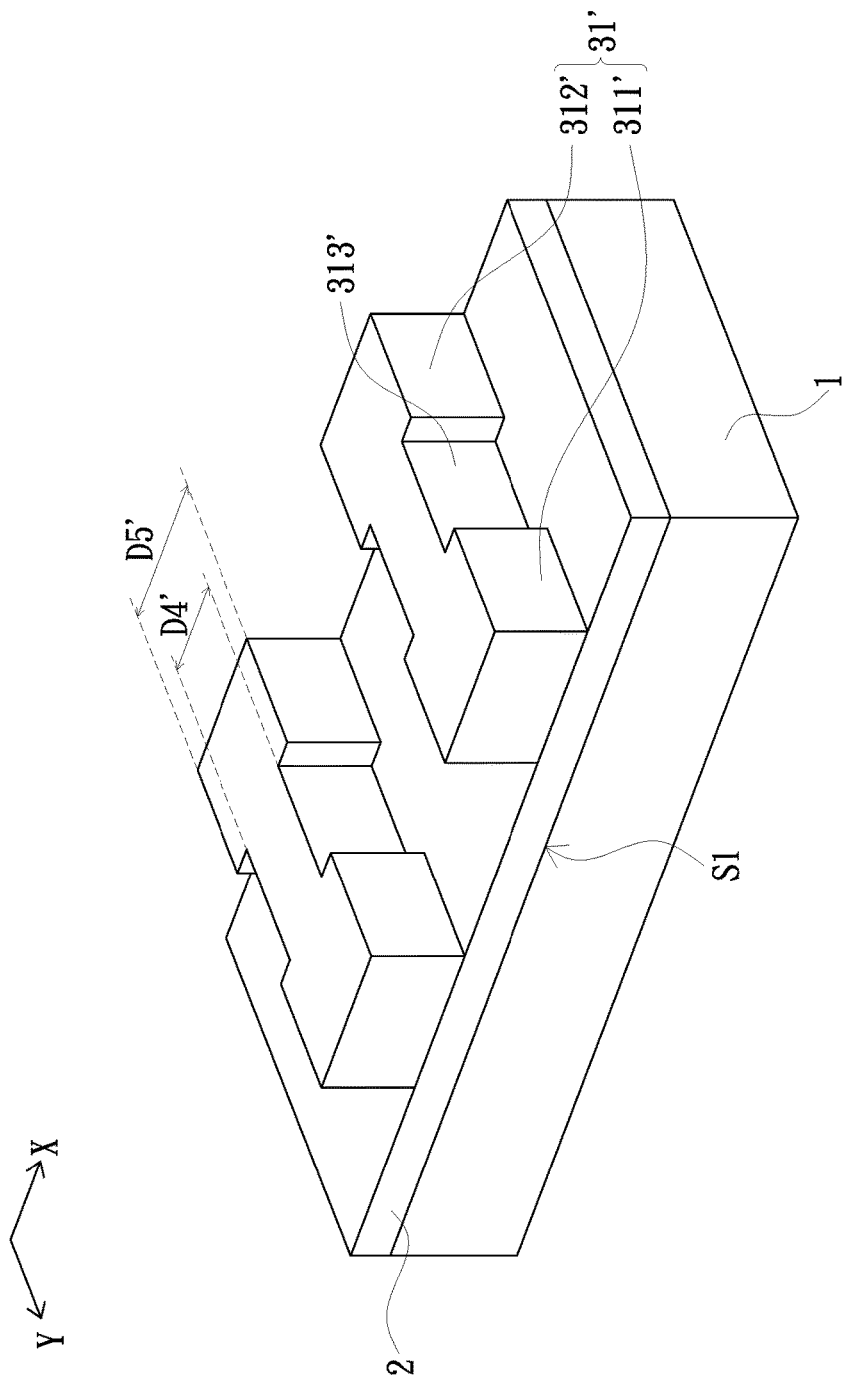
Figure 2C:
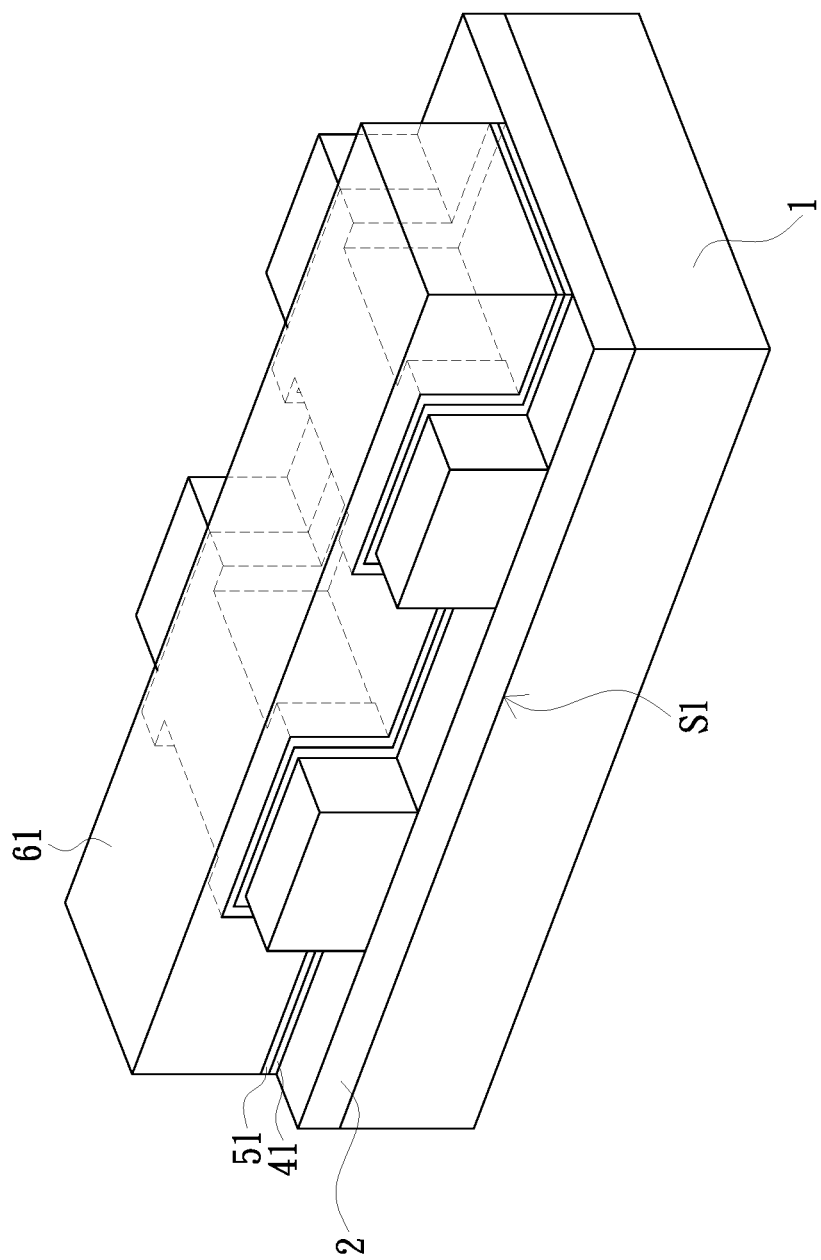

While concepts of the above methods and structures of the present invention may be similarly applied to multi-gate field-effect transistors, they are different from the conventional fin field-effect transistors (FinFET). In the following, taking one embodiment of the present invention as an example to describe a multi-gate field-effect transistor fabricated according to the concepts of the above methods and structures of the present invention. FIGS. 2A-2C are schematic structural views of a fin field-effect transistor at different manufacturing steps in accordance with an embodiment of the present invention. For the ease of understanding, the same components with the same functions are annotated by the same reference numbers, and are not intended to limit the present invention.

As shown in FIG. 2A, similar to the steps illustrated in FIGS. 1A and 1B of the previous embodiment, an oxide layer 2 is optionally formed to cover the surface S1 of the substrate 1, and a thickness of the oxide layer 2 is in a range of 15-30 nanometers. In the present embodiment, the oxide layer 2 is formed over the surface S1 of the substrate 1 by performing a thermal oxidation step over the substrate 1 made of polysilicon. In other embodiments, the oxide layer 2 may be formed by deposition or other methods. Next, a conductive material layer (similar to the conductive material layer 3 in the previous embodiment) is formed over the oxide layer 2, a thickness of the conductive material layer is in a range of 40-80 nanometers, and the materials may be semiconductor or metal. In the present embodiment, the conductive material layer is a silicon layer formed by deposition. Next, the source/drain structure 31 and the fin structure 313 are formed by removing portions of the conductive material layer as shown in FIG. 2A. The source/drain structure 31 includes a source 311, a drain 312, and the fin structure 313 disposed between the source 311 and the drain 312 for connecting the two. Similar to the source/drain structure 31 in the previous embodiment, the present embodiment merely changes the pattern of the mask layer (not illustrated) used in the etching process so that the source/drain structure 31 and the fin structure 313 can be formed in a single step. A fin length D3 (i.e. the length along the Y-axis direction, which is also a shortest/straight-line distance of the source 311 and the drain 312) of the fin structure 313 is in a range of 10-50 nanometers, and a fin width D4 is 5-20 nanometers; wherein the fin length D3 is preferably between 20-30 nanometers. Moreover, as shown in FIG. 2A, the width D5 of the source/drain structure 31 is greater than the fin width D4 of the fin structure 313. Shapes of the source 311 and the drain 312 are exemplarily illustrated and are not limited to those shown in the figures. Sizes of the source 311 and the drain 312 in the present embodiments are about a square of 40 nm×40 nm. In addition, there is no limitation for the shape of the fin structure 313, which is shown as a rectangular configuration over the X-axial cross sectional view in the present embodiment. In other embodiments, the fin structure 313 may be trapezoidal shaped, or of a narrow-top and wide-bottom configuration; but the present invention is not limited thereto. The length, width, and height can be adjusted according to different embodiments.

Next, the fin structure 313 is optionally oxidized by methods such as plasma treatment or high temperature thermal oxidation to fully oxidize the fin structure 313. At this step, since sizes of the source 311 and drain 312 are greater than the size of the fin structure 313 (that is, the source 311, the drain 312 and the fin structure 313 have the same height, but the fin structure 313 has a smaller width than those of the source 311 and the drain 312), oxidation of the source 311 and the drain 312 can be controlled and only (peripheral) portions of the source 311 and portions of the drain 312 are oxidized while the fin structure 313 is fully oxidized. Next, oxidized portions the source 311 and the drain 312 are removed to expose portions of the conductive material of the source 311' and the drain 312'. Preferably along the X-axial structural cross-section, the source 312' and the drain 312' have a width D5' that is greater than the fin width D4' of the fin structure 313' after the etching process, as shown in FIG. 2B. In the present embodiment, high temperature thermal oxidation is used to oxidize the fin structure 313 and the source/drain structure 31, thereby fully oxidizing the fin structure 313 and partially oxidizing the source 311 and the drain 312. Next, the oxidized portions of the source 311 and the drain 312 are removed by etching to expose portions of the source 311' and the drain 312' having the original conductive materials, and to remain portions of the source 311' and drain 312' having a width D5' along the X direction that is greater than the fin width D4'. In some embodiments of the present invention, a blocking layer (or a photoresist layer; not illustrated) can be used to cover the fin structure 313, so that only the source/drain structure 31 would be etched and the fin structure 313' equivalent to the fin structure 311 can be formed. In this way, the height of the formed fin structure 313' is greater than the height of the source/drain structure 31'. Process parameters used in the above processes can be obtained by one skilled in the art in limited numbers of trials and are not to be described in detail herein.

The fin structure 313' is covered with the two-dimensional channel layer 41 in a subsequent process step. Therefore, similar to the planar field-effect transistor and the oxidation step as described above, oxidation of the fin structure 313 is optionally performed (the function thereof is identical to the oxide layer 2 in the previous embodiment), so that the exposed surfaces of the fin structure 313 are dielectric materials to ensure conduction of electric currents can by the subsequently formed two-dimensional channel layer. In other embodiments of the present invention, an additional oxide layer can be formed to cover the fin structure 313 to achieve the same effect without the needs to remove portions of the source/drain structure 31 and form the source/drain structure 31'. The same source/drain structure 31 will be used at the following process steps.

The following steps and conditions are similar to those associated with FIGS. 1C-1E of the previous embodiment, and are not to be described in the followings. Detailed process conditions and selections of the materials can be decided based on the above descriptions.

As shown in FIG. 2C, a transition metal dichalcogenides compound layer (similar to the transition metal dichalcogenides compound layer 4 in the previous embodiment) is formed to conformally cover at least portions of the source/drain structure 31' and the fin structure 313' between the source 311' and the drain 312'. The formation method is the same as previously described, and molybdenum disulfide is used as the transition metal dichalcogenides compound layer in the present embodiment. Although it is impossible to form a layer of molybdenum disulfide to cover the entire substrate 1, the molybdenum disulfide layer is enough to entirely cover the fin structure 31' between the source 311' and the drain 312', and may optionally cover portions of the source 311' and the drain 312' close to the fin structure 313'. In the present embodiment, the transition metal dichalcogenides compound layer made of molybdenum disulfide has a controlled thickness that is less than 5 nanometers. Next, a dielectric layer (similar to the dielectric layer 5 in the previous embodiment) having a thickness of about 2-5 nanometers is optionally formed to conformally cover the substrate 1, the source/drain structure 31', the fin structure 313', and the transition metal dichalcogenides compound layer. A gate material layer (similar to the gate material layer 6 in the previous embodiment) having a thickness in a range of 40-80 nanometers is then formed to conformally or planarly cover the dielectric layer. Next, the gate dielectric layer, the dielectric layer, and the transition metal dichalcogenides compound layer are patterned to form the gate layer 61, the dielectric layer 51, and the two-dimensional channel layer 41, so that the three layers form a stack that vertically covers and crosses the fin structure 313' and portions of the source 311' and the drain 312 and has an extension direction vertical to a connection line of the source 311' and the drain 312'. As described above, the gate layer 61 and/or the dielectric layer 51 cover the two-dimensional channel layer 41, so that the two dimension layer 41 is protected from removal in the subsequent processes. In order to cover portions of the source 311' and the drain 312' with the two-dimension channel layer 41 to prevent exceedingly large contact resistance, it is necessary to prevent the two dimension channel layer 41 from removal during the step of patterning the gate material layer 6. In the present embodiment, the stack comprising the gate layer 61, the dielectric layer 51, and the two-dimension channel layer 41 is formed to cover the fin structure 313' and portions of the source 311' and portions of the drain 312' close to the fin structure 313' by a single etching. According to the processes used in the present embodiment, the gate layer 61, the dielectric layer 51, and the two-dimensional layer 41 are entirely and completely overlapped. In addition, doping and activation of the source/drain structure 31' (or the source/drain structure 31) can be optionally performed before formation of the transition metal dichalcogenides compound layer, or after formation of the gate layer 61.

It is noted that the range of the fin length D3 of the fin structure 313 as provided above is limited by existing fabrication technology, thus hindering further reduction in the fin length D3. However, such issue does not affect applications and formations of the two-dimensional channel layer 41 of the present invention. Based on the theories described above, the two-dimensional channel layer 41 can be applied in fin structures with further reduced sizes.

Thus, while different from conventional FinFETs, the embodiments of the present invention are also multi-gate field-effect transistor and are similar to the conventional FinFETs in their shapes. Besides, in addition to the embodiments described above, methods and structures provided by the present invention can be directly applied to the conventional FinFET structures. For example, an oxide layer can be optionally formed over a fin structure after forming source/drain by an epitaxial process, and the method of the present invention described above can be performed to form the two-dimensional channel layer to cover the fin structure and portions of the source/drain structure.

Accordingly, fabrication processes and structures of the present invention allow successful application of the two-dimensional materials in semiconductors, such as electronic devices or transistors, and in conventional fabrication methods to reduce channel sizes and improve performance of the product, by utilizing the good semiconductor properties of the transition metal dichalcogenides. While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A field-effect transistor structure having two-dimensional transition metal dichalcogenides, comprising:
    a substrate;
    a source/drain structure, disposed on the substrate, having a surface higher than a surface of the substrate, and comprising a source and a drain, wherein an opening is formed between the source and the drain, and the opening separates the source and the drain;
    a two-dimensional (2D) channel layer, disposed on the source and the drain and covering a portion of the source/drain structure and a space between the source and the drain, wherein the 2D channel layer does not cover a part of the source and a part of the drain; and
    a gate layer, disposed between the source and the drain and covering the 2D channel layer, wherein the field-effect transistor structure having two-dimensional transition metal dichalcogenides is a fin field-effect transistor, the source is connected with the drain by a fin structure, and a width of the source/drain structure is greater than a fin width of the fin structure.

2. The field-effect transistor structure having two-dimensional transition metal dichalcogenides according to claim 1, wherein the gate layer and the 2D channel layer are entirely overlapped.

3. The field-effect transistor structure having two-dimensional transition metal dichalcogenides according to claim 1, wherein the 2D channel layer conformally covers the entire fin structure between the source and the drain, a portion of the drain close to the source and a portion of the source close to the drain.

4. The field-effect transistor structure having two-dimensional transition metal dichalcogenides according to claim 1, wherein a minimum distance between the source and the drain is about 2-15 nanometers.

5. The field-effect transistor structure having two-dimensional transition metal dichalcogenides according to claim 4, wherein the minimum distance is less than 10 nanometers.

6. The field-effect transistor structure having two-dimensional transition metal dichalcogenides according to claim 1, wherein the 2D channel layer has a thickness of about 0.6-5 nanometers.

7. The field-effect transistor structure having two-dimensional transition metal dichalcogenides according to claim 1, wherein the 2D layer comprises a material of one of molybdenum disulfide, tungsten diselenide, tellurium disulfide, and tellurium diselenide.

8. The field-effect transistor structure having two-dimensional transition metal dichalcogenides according to claim 1, wherein the 2D channel layer are entirely overlapped by the gate layer.

9. The field-effect transistor structure having two-dimensional transition metal dichalcogenides according to claim 1, further comprising a high-k dielectric layer formed between the 2D channel layer and the gate layer.

10. The field-effect transistor structure having two-dimensional transition metal dichalcogenides according to claim 1, wherein a material of the fin structure is identical to a material of the substrate.

11. The field-effect transistor structure having two-dimensional transition metal dichalcogenides according to claim 1, further comprising an oxide layer formed on the surface of the substrate and disposed between the substrate and the 2D channel layer and between the substrate and the fin structure.

* * * * *